(12) United States Patent
Davis et al.

(10) Patent No.: US 10,575,098 B2
(45) Date of Patent: Feb. 25, 2020

(54) SPEAKER APPARATUS HAVING A HEAT DISSIPATION STRUCTURE

(71) Applicant: NOKIA TECHNOLOGIES OY, Espoo (FI)

(72) Inventors: Ian Davis, Delgany (IE); Rudi O'Reilly Meehan, Dublin (IE); Akshat Agarwal, Donate (IE)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/895,382

(22) Filed: Feb. 13, 2018

(65) Prior Publication Data

US 2019/0253803 A1 Aug. 15, 2019

(51) Int. Cl.
*H04R 9/02* (2006.01)
*H05K 7/20* (2006.01)
*H04R 1/02* (2006.01)

(52) U.S. Cl.
CPC ............ *H04R 9/022* (2013.01); *H04R 1/025* (2013.01); *H05K 7/20309* (2013.01); *H05K 7/20318* (2013.01); *H05K 7/20336* (2013.01); *H05K 7/20409* (2013.01); *H05K 7/20463* (2013.01); *H05K 7/20518* (2013.01); *H04R 2499/11* (2013.01)

(58) Field of Classification Search
None
See application file for complete search history.

(56) References Cited

U.S. PATENT DOCUMENTS

| 4,138,593 | A | 2/1979 | Hasselbach et al. |
| 4,210,778 | A | 7/1980 | Sakurai et al. |
| 5,560,362 | A | 10/1996 | Sliwa, Jr. et al. |
| 7,181,039 | B2 | 2/2007 | Stiles et al. |
| 7,801,320 | B2 | 9/2010 | Mellow |
| 8,292,023 | B2 | 10/2012 | Slotte |
| 8,561,756 | B2 | 10/2013 | Litovsky et al. |

(Continued)

FOREIGN PATENT DOCUMENTS

| CN | 203149475 U | 8/2013 |
| CN | 106482562 A | 3/2017 |
| CN | 108238775 A | 7/2018 |
| JP | 2004 274383 A | 9/2004 |
| KR | 101756673 B1 | 7/2017 |
| WO | WO 2014118623 A2 | 8/2014 |

OTHER PUBLICATIONS

Dual Cool Jets (Brochure) [online] [retrieved Mar. 9, 2018]. Retrieved from the Internet: <URL: https://www.aavid.com/sites/default/files/products/pulse-jets/dual-cool-jet-specification.pdf>. (undated) 1 page.

(Continued)

*Primary Examiner* — Paul W Huber
(74) *Attorney, Agent, or Firm* — Alston & Bird LLP

(57) ABSTRACT

A speaker apparatus is provided in order to both receive and dissipate heat and to provide acoustic absorption for sound waves propagating through a speaker cavity. The speaker apparatus includes a speaker and a speaker cavity configured to receive sound waves emitted by the speaker for propagation through the speaker cavity. The speaker apparatus also includes a heat dissipation structure disposed at least partially within the speaker cavity. The heat dissipation structure includes a heat pipe or a heat sink configured to receive heat from a component that generates heat. The heat dissipation structure is configured to provide acoustic absorption for the sound waves propagating through the speaker cavity.

16 Claims, 3 Drawing Sheets

(56) References Cited

U.S. PATENT DOCUMENTS

| | | |
|---|---|---|
| 8,630,435 B2 | 1/2014 | Mellow et al. |
| 9,092,204 B2 | 7/2015 | Chou et al. |
| 9,648,403 B2 | 5/2017 | Papalcyriacou et al. |
| 2002/0057811 A1 | 5/2002 | Burleson et al. |
| 2008/0106171 A1 | 5/2008 | Mongia |
| 2008/0188755 A1 | 8/2008 | Hart |
| 2013/0312429 A1 | 11/2013 | Greuet et al. |
| 2016/0120019 A1 | 4/2016 | Shedd et al. |
| 2016/0212543 A1 | 7/2016 | Kochendoerfer et al. |
| 2016/0345090 A1 | 11/2016 | Wilk et al. |
| 2017/0353785 A1 | 12/2017 | Choi et al. |
| 2018/0152790 A1 | 5/2018 | Dong et al. |

OTHER PUBLICATIONS

Lu, T.J. et al., "Sounds absorption of cellular metals with semiopen cells", The Journal of the Acoustical Society of America, vol. 108(4) (Oct. 2000) pp. 1697-1709.

Zarid, Z et al., TACS: "Thermo Acoustic Cooling System", World Academy of Science, Engineering and Technology International Journal of Environmental and Ecological Engineering, vol. 7, No. 8 (2013) pp. 539-543.

Benschop, J., How to Design Enclosures for Heat Dissipation [online] [retrieved Mar. 16, 2018]. Retrieved from the Internet : <URL: https://itstillworks.com/design-enclosures-heat-dissipation-12019985.html>. (undated) 2 pages.

International Search Report and Written Opinion for Application No. PCT/FI2019/050074 dated Apr. 24, 2019, 15 pages.

International Search Report and Written Opinion for Application No. PCT/FI2019/050075 dated Apr. 24, 2019, 14 pages.

Hokmark, B., *Acoustic Analysis of Loudspeakers Cavity Including Viscothermal Effects*, Master's Dissertation Lund University (2006) 30 pages.

Nijhof, M., *Viscothermal Wave Propagation*, (Nov. 2010) 348 pages.

Office Action for U.S. Appl. No. 15/895,441 dated Mar. 28, 2019.

Office Action for U.S. Appl. No. 15/895,441 dated Aug. 27, 2019.

SPEAKER APPARATUS HAVING A HEAT DISSIPATION STRUCTURE

TECHNOLOGICAL FIELD

An example embodiment relates generally to a speaker apparatus and, more particularly, to a speaker apparatus having a heat dissipation structure disposed at least partially within a speaker cavity so as to both dissipate heat and to provide acoustic absorption.

BACKGROUND

Loudspeakers, or speakers, are included in a wide variety of devices. For example, telecommunications devices, such as mobile telephones or smartphones, include speakers for audio communication as well as for video and audio media playback.

In free space, the soundwaves emitted by the different sides of the speaker, such as the front and the back of the speaker, will interact and cause undesired cancellation affects. In order to reduce the undesired cancellation affects, speakers are generally placed within an enclosure that defines a speaker cavity to the rear of the speaker filled with, for example, air.

While placement of the speaker within an enclosure mitigates the undesired cancellation affects, the enclosure and, more particularly, the speaker cavity defined by the enclosure may create other issues. In this regard, the air within the speaker cavity acts as a spring having a stiffness proportional to the volume of the speaker cavity. A small speaker cavity has a high stiffness and will therefore impede the motion of the speaker membrane. The impedance of the speaker membrane reduces the efficiency of the speaker, particularly at low frequencies. While larger speaker cavities do not impede the motion of the speaker membrane to as great of a degree, many devices including telecommunication devices, such as mobile telephones, hands free communication devices and laptop and tablet computers, have only limited space available for the speaker such that the enclosure and the resulting speaker cavity must be relatively small. As a result, the speakers housed by such relatively small enclosures may provide sub-optimal sound quality including, for example, the "tinny" sound provided by some speakers disposed within small enclosures.

The challenges associated with the dedication of a sufficient volume within a device for a speaker cavity may be further complicated by the electronic components that are also included within the device, such as a telecommunications device, that includes a speaker. At least some of the components, such as central processing units, graphical processing units, optical modules or the like, have a relatively large heat flux and therefore generate substantial heat while in use. In order remove the heat and ensure that the components remain at a temperature that permits the components to operate properly, conductive or multiphase thermal paths may be provided between the components that serve as the sources of heat and the surrounding environment. However, these thermal paths also have volumetric requirements and restrictions in terms of their proximity to other components that are temperature-sensitive.

Thus, the allocation of the volume within a device, such as a telecommunications device, that includes a speaker must take into account a number of competing considerations including the size of the speaker cavity and the necessity for thermal paths to dissipate heat generated by various components of the device. This design challenge has generally increased over time as improvements in the performance of the devices has typically led to an increase in the heat flux generated by the components of the device that must be dissipated. Moreover, the desire for further miniaturization of the devices, such as telecommunications devices, has imposed increasingly stringent restrictions on the volume available for heat dissipation, speaker cavities and the like.

In an effort to improve the performance of speakers, alternative enclosures for speakers have been considered. For example, ported enclosures have been designed that define a small vent attached to a relatively short waveguide. The vent changes the acoustic characteristics of the enclosure from a sealed box to a Helmholtz resonator. The air inside the relatively small waveguide and the speaker cavity acts as a mass-spring system, which has a different reactance than that provided by a sealed speaker cavity. This change in reactance can lead to enhanced speaker efficiency at low frequencies. Similarly, transmission line enclosures, quarter wavelength enclosures and passive radiators have been developed that also change the acoustic performance of a speaker. Further, enclosures have been designed in which the volume provided by the speaker cavity is filled with a material to lower the characteristic speed of sound within the speaker cavity, thereby increasing the effective volume of the speaker enclosure and reducing the impedance to the speaker motion. However, these alternative enclosure designs have increased complexity and, as a result, may be more challenging and expensive to manufacture, particularly for small devices.

BRIEF SUMMARY

A speaker apparatus is provided in accordance with an example embodiment in order to both receive and dissipate heat and to provide acoustic absorption for sound waves propagating through a speaker cavity. In this regard, the speaker apparatus may include a heat dissipation structure disposed at least partially within the speaker cavity to receive heat from a component, such as a component associated with the speaker apparatus and to dissipate the received heat, thereby providing for improved performance by the component that generates heat. By providing acoustic absorption, the heat dissipation structure increases the effective air volume of the speaker cavity apparatus and reduces the impedance to speaker motion, thereby providing for improved speaker performance. By providing for both heat dissipation and acoustic absorption by a heat dissipation structure disposed at least partially within the speaker cavity, the speaker apparatus of an example embodiment may address these competing concerns and provide for improved speaker performance in devices, including relatively small devices having a limited volume available for a speaker cavity and for the thermal paths necessary for heat dissipation.

In an example embodiment, a speaker apparatus is provided that includes a speaker and a speaker cavity configured to receive sound waves emitted by the speaker for propagation through the speaker cavity. The speaker apparatus also includes a heat dissipation structure disposed at least partially within the speaker cavity. The heat dissipation structure includes at least one of a heat pipe or a heat sink configured to receive heat from a component that generates heat. The heat dissipation structure is configured to provide acoustic absorption for the sound waves propagating through the speaker cavity.

The heat dissipation structure of an example embodiment includes a plurality of tubes, such as a plurality of copper tubes, extending outwardly from the heat sink into the speaker cavity. In another example embodiment, the heat pipe includes a straight heat pipe having a phase change material disposed therein. The straight heat pipe includes an evaporator in thermal communication with the component that generates heat and a condenser that extends further into the speaker cavity than the evaporator. In yet another example embodiment, the heat pipe includes a looped heat pipe having a phase change material disposed therein. The looped heat pipe includes an evaporator in thermal communication with the component that generates heat and a condenser that is disposed further into the speaker cavity than the evaporator. The condenser of the looped heat pipe may include a serpentine portion of the heat pipe. The speaker apparatus of an example embodiment also includes a porous medium disposed within the speaker cavity with the heat pipe extending through the porous medium and into the speaker cavity.

In another example embodiment, the speaker apparatus includes a speaker and a speaker cavity configured to receive sound waves emitted by the speaker for propagation through the speaker cavity. The speaker apparatus also includes a heat dissipation structure disposed at least partially within the speaker cavity. The heat dissipation structure includes a heat sink and a plurality of tubes extending outwardly from the heat sink into the speaker cavity. The heat sink is configured to receive heat from a component that generates heat. The heat dissipation structure is configured to provide acoustic absorption for the sound waves propagating through the speaker cavity.

The plurality of tubes of an example embodiment define a tube array formed of the plurality of evenly spaced tubes. In this embodiment, the tubes may have respective diameters equal to a spacing between neighboring tubes. The tubes may be formed of a thermally conductive material, such as copper. The heat sink of an example embodiment is formed of a metal. In this example embodiment, the heat dissipation structure further includes a thermal interface material between the heat sink and the component that generates heat.

In a further example embodiment, a speaker apparatus is provided that includes a speaker and a speaker cavity configured to receive sound waves emitted by the speaker for propagation through the speaker cavity. The speaker apparatus also includes a heat dissipation structure disposed at least partially within the speaker cavity. The heat dissipation structure includes a heat pipe having a phase change material disposed therein. The heat pipe is configured to receive heat from a component that generates heat. The heat pipe includes an evaporator in thermal communication with the component that generates heat and a condenser that extends further into the speaker cavity than the evaporator. The heat dissipation structure is configured to provide acoustic absorption for the sound waves propagating through the speaker cavity.

The heat pipe of an example embodiment includes a straight heat pipe that extends from the component that generates heat further into the speaker cavity. The heat pipe of another example embodiment includes a looped heat pipe configured to circulate the phase change material through the speaker apparatus. The condenser of the looped heat pipe includes a serpentine portion. The speaker apparatus of an example embodiment also includes a porous medium, such as a metallic mesh, disposed within the speaker cavity. The heat pipe of this example embodiment extends through the porous medium and into the speaker cavity. The heat dissipation structure of an example embodiment is formed of a plurality of layers of an additively manufactured metal.

BRIEF DESCRIPTION OF THE DRAWINGS

Figure 1:
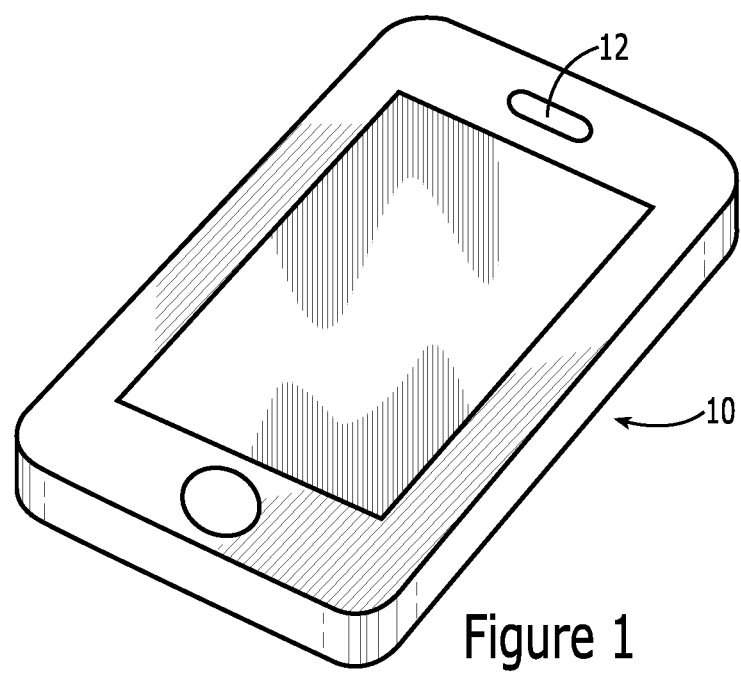
Figure 2:
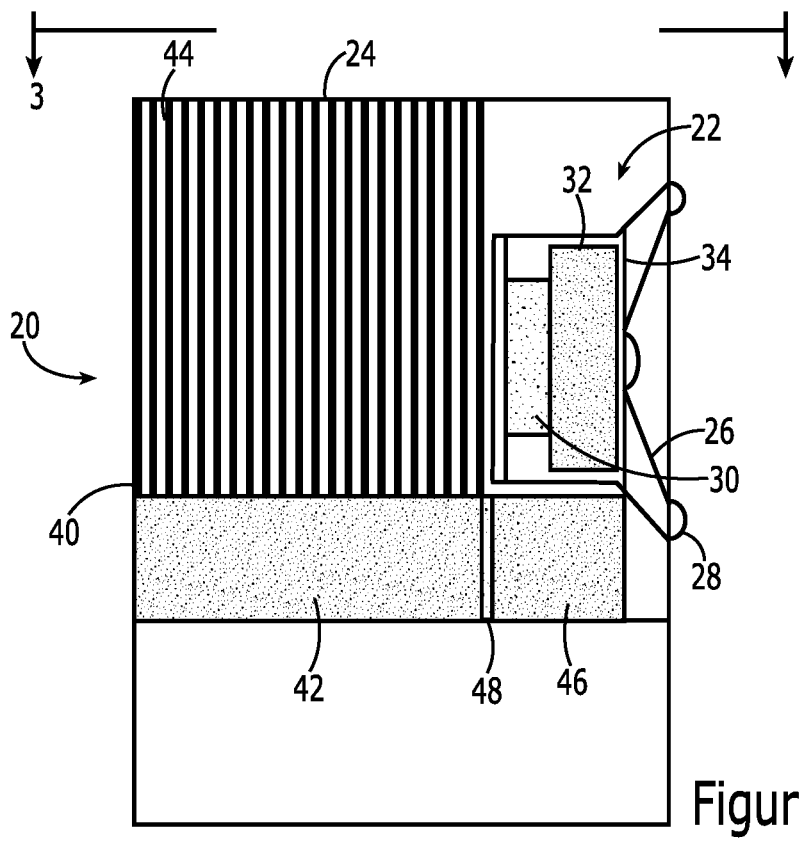
Figure 3:
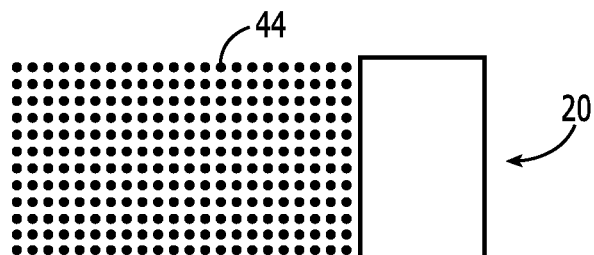
Figure 4:
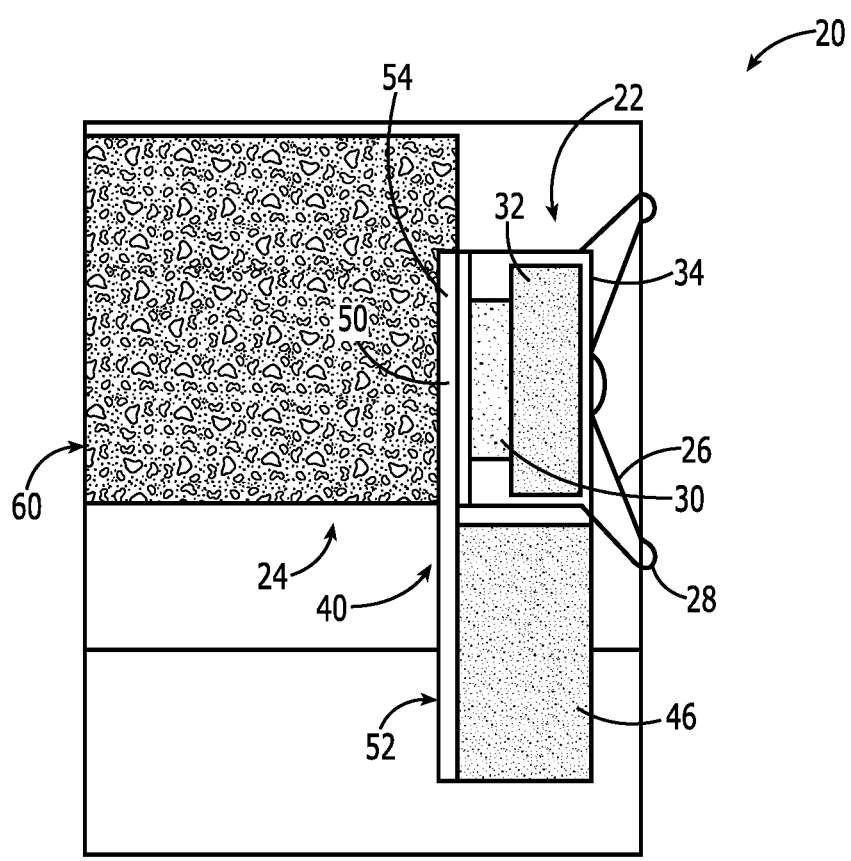
Figure 5:
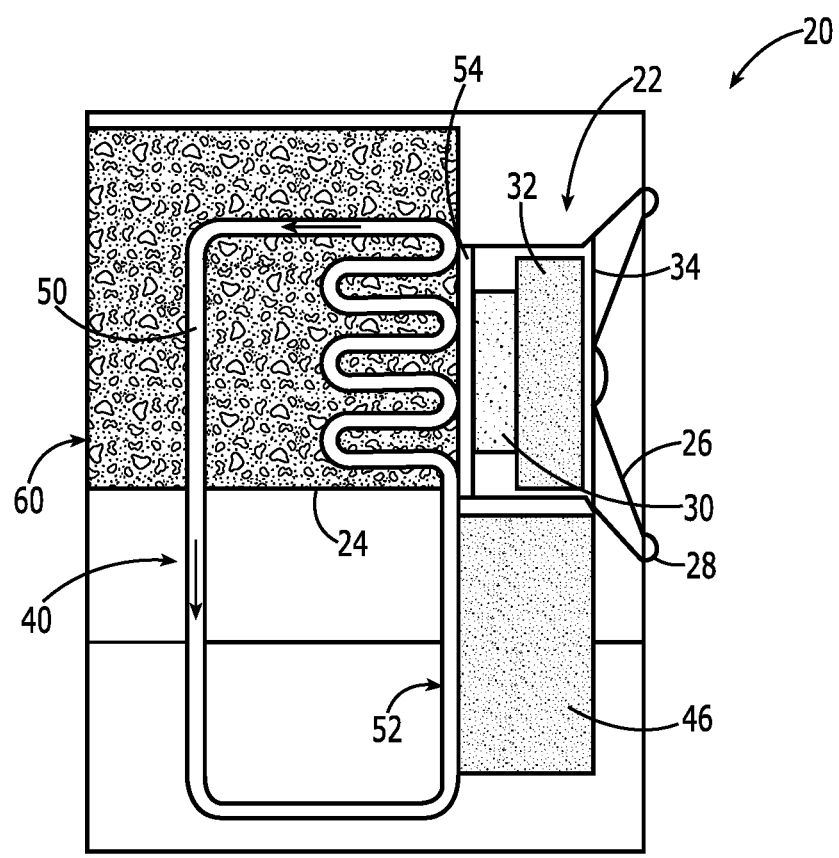

Having thus described certain example embodiments of the present disclosure in general terms, reference will now be made to the accompanying drawings, which are not necessarily drawn to scale, and wherein:

FIG. 1 is a perspective view of an electronic device including one or more speakers;

FIG. 2 is a cross-sectional view of a speaker apparatus having a heat dissipation structure including a heat sink and a plurality of tubes extending into a speaker cavity in accordance with an example embodiment of the present disclosure;

FIG. 3 is a top view of the tube array of FIG. 2 disposed at least partially within the speaker cavity in accordance with an example embodiment of the present disclosure;

FIG. 4 is a cross-sectional view of a speaker apparatus having a heat dissipation structure including a straight heat pipe that extends into a speaker cavity in accordance with another example embodiment of the present disclosure; and FIG. 5 is a cross-sectional view of a speaker apparatus having a heat dissipation structure including a looped heat pipe that extends through a speaker cavity in accordance with a further example embodiment of the present disclosure.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

A wide variety of electronic devices include one or more speakers for supporting voice communications, video playback, audio playback or for other purposes. The electronic devices that include speakers include various telecommunications devices, such as a mobile telephone 10 as shown in FIG. 1, as well as other electronic devices, such as a tablet computer, a portable computer, a gaming system, a personal navigation system, hands free communication devices, audio and/or video system or the like. A number of the electronic devices that include speakers 12 are relatively small and the design objective for a number of the electronic devices having speakers including, for example, telecommunications devices, such the mobile telephone of FIG. 1, is to further miniaturize the devices. Further reductions in size increase the challenges associated with providing speakers that perform as desired while concurrently dissipating the heat generated by components of the electronic device to ensure continued, reliable performance of the electronic device by maintaining the temperature of the components within an acceptable operating temperature range.

In order to address the competing objectives of a speaker cavity having a sufficient volume to permit proper speaker operation and the dissipation of the heat, such as heat generated by components associated with the electronic device, in a manner that does not negatively impact other thermally sensitive components of the device, a speaker apparatus is provided in accordance with an example embodiment that includes a heat dissipation structure disposed at least partially within the speaker cavity. The speaker apparatus may be configured in various manners. For example, the speaker apparatus may be a combined module including both a speaker 22, that is, a transducer, and a speaker enclosure 20 that is physically integrated with the speaker and that defines a speaker cavity 24. Alternatively, the speaker apparatus may include a speaker and a speaker enclosure that is separate from the speaker, but acoustically and/or mechanically coupled thereto. Still further, the speaker apparatus may include the speaker enclosure that defines the speaker cavity for receiving sound waves from a speaker that is acoustically and/or mechanically coupled to the speaker enclosure. In the foregoing embodiments, the speaker apparatus includes a speaker enclosure 20 that defines a speaker cavity configured to receive sound waves emitted by a speaker for propagation through the speaker cavity. The speaker enclosure of one embodiment may be comprised of a dedicated housing as illustrated herein. Alternatively, the speaker enclosure may be formed by the interior air volume of an electronic device, such as a mobile telephone, a tablet or portable computer or the like with the housing of the electronic device forming the boundaries of the speaker enclosure as well as encompassing other components of the electronic device.

The speaker 22 may be assembled with the speaker enclosure 20 so as to form a speaker module. Alternatively, the speaker may be separated from the speaker enclosure, but acoustically and/or mechanically coupled to the speaker enclosure. Although the speaker may be configured in various manners, the speaker of one example embodiment is depicted in FIGS. 2, 4 and 5 to be disposed within an opening defined by a speaker enclosure. The speaker includes a diaphragm 26 that extends over the opening and may be secured or sealed to the enclosure by a gasket 28 that extends about the opening. The speaker of this example embodiment also includes a magnet 30 and an overlying pole piece 32. The speaker of this example embodiment further includes a spider 34 that extends across the opening defined by the speaker enclosure between the pole piece and the diaphragm. As shown, the diaphragm may be secured to a medial portion of the spider in order to move therewith in order to generate sound waves upon operation of the speaker.

The sound waves not only propagate outwardly from the speaker 22 into the surrounding environment, such as in a direction extending to the right in the cross-sectional view of FIGS. 2, 4 and 5, but also to the rear of the speaker, such as to the left in the cross-sectional view of FIGS. 2, 4 and 5. In order to reduce the effect of the sound waves propagating to the rear of the speaker and to avoid destructive interference with the sound waves propagating in other directions from the speaker, the speaker enclosure 20 defines a speaker cavity 24. The speaker cavity is configured to receive sound waves emitted by the speaker with the sound waves propagating through the speaker cavity. As shown in FIGS. 2, 4 and 5, the speaker cavity is generally disposed rearward of the speaker, such as on the opposite side of the speaker from the diaphragm 26.

In accordance with an example embodiment, the speaker apparatus further includes a heat dissipation structure 40 disposed at least partially and, in some embodiments, completely, within the speaker cavity 24. As described below, the heat dissipation structure may be configured in various manners, but generally includes a heat pipe and/or a heat sink configured to receive heat and dissipate heat from a component, such as a component associated with the speaker apparatus, e.g., a component fully or partially disposed within the speaker enclosure 20, that generates heat. Various types of components generate heat that is advantageously dissipated including, for example, a central processing unit, a graphical processing unit, an integrated circuit including an application specific integrated circuit, a battery, a light emitting diode, a memory device such as a random access memory or the like. By receiving and dissipating heat, the components, such as the components associated with the speaker apparatus, may remain within a desired operating temperature range, thereby improving the performance or permitting the electronic device to remain operational for a longer period of time. The heat dissipation structure is also configured to provide acoustic absorption for the sound waves propagating through the speaker cavity. As a result of the increased acoustic absorption provided by the heat dissipation structure, the characteristic speed of sound within the speaker cavity is reduced, thereby increasing the effective air volume of the speaker enclosure 20, and reducing the impedance to motion by the diaphragm 26 of the speaker 22. As a result, speaker performance is improved relative to speaker performance of a speaker associated with a speaker enclosure of the same size that lacks a heat dissipation structure. By providing a heat dissipation structure disposed at least partially within the speaker cavity in order to both receive heat and provide acoustic absorption, the limited space available within the electronic device is advantageously utilized for multiple purposes by concurrently addressing requirements relating to thermal management and speaker performance.

With reference to FIG. 2, one example of a speaker apparatus is provided. In this example embodiment, the heat dissipation structure 40 includes a heat sink 42 and a plurality of tubes 44 extending outwardly from the heat sink into the speaker cavity 24. The heat sink may also be disposed within the speaker cavity or may be disposed proximate the speaker cavity with the tubes extending outwardly therefrom into the speaker cavity. The heat sink is formed of a thermally conductive material, such as aluminum or copper, and is configured to receive heat from a component, such as a component associated with the speaker apparatus, that generates heat. As shown in FIG. 2, the component 46 may also be disposed within a speaker enclosure and in thermal communication with the heat sink, such as due to a proximal relationship thereto. Alternatively, the component may be external to the speaker enclosure, but the heat generated by the component may be directed to the heat sink by a thermally conductive thermal path. In either instance, the heat sink is in thermal communication with the heat generating component, either directly with the component or via a thermal path leading to the component.

A variety of different types of components 46 of an electronic device generate heat. For example, a central processing unit, a graphical processing unit, an optical module, a battery, a motherboard as well as other types of components generate heat that is advantageously dissipated in a controlled fashion such that the components remain within a desired operating temperature range to ensure their continued, reliable operation without undesirably increasing the temperature of any other temperature sensitive component(s) within the electronic device.

The heat sink 42 may be in direct thermal communication with the component 46 that generates the heat or with the thermal path that delivers the heat generated by the component. In one embodiment, however, the speaker apparatus also includes a thermal interface material 48 positioned between the heat sink and the component that generates the heat (or the thermal path that leads from the component) in order to facilitate the transfer of the heat from the component to the heat sink. The thermal interface material may be formed of various thermally conductive materials including, for example, thermal grease, low temperature alloy solder or gap filler pads.

The heat received from the component 46 that generates the heat flows through the heat sink 42 and, in turn, through the plurality of tubes 44 extending outwardly from the heat sink into the speaker cavity 24. Although the plurality of tubes may be configured in various manners, the plurality of tubes of an example embodiment define a tube array comprised of a plurality of equally spaced tubes. In this regard the plurality of equally spaced tubes of a tube array is shown from the side in FIG. 2 and from the top in FIG. 3. While the tube array of the illustrated embodiment is a rectangular tube array, the tube array may have other shapes and sizes depending upon, for example, the shape and size of the speaker cavity. Typically, the tube array generally fills the volume provided by the speaker cavity or at least a central portion of the volume defined by the speaker cavity.

Although the tubes 44 may be spaced from one another by different distances, such as distances that are smaller or larger than the diameter of the tubes, the tubes of one example embodiment have the same diameter and the spacing between neighboring tubes is equal to the diameter of the tubes. By way of example, in an embodiment in which the speaker cavity 24 has a volume of 2 cm$^3$ with dimensions of 4 cm×1 cm×0.5 cm, a tube array could include 20 rows of tubes with 5 tubes per row. Each tube of this example may have a diameter of 1 mm and a height of 5 mm with the spacing between neighboring tubes equal to the diameter of 1 mm.

The plurality of tubes 44 are formed of a thermally conductive material. The plurality of tubes may be formed with the same thermally conductive material as the heat sink 42 or of a different thermally conductive material. In one example embodiment, however, the plurality of tubes are all formed of copper. The plurality of tubes may be solid tubes, while, in other embodiments, at least some of the tubes are hollow. As a result of thermal conductivity of the heat sink and the plurality of tubes and the thermal path provided by the heat dissipation structure 40 from the component 46 that generates heat, heat generated by the component propagates through the heat sink and through the plurality of tubes. The heat is dissipated from the tube array via conduction and rejected to the atmosphere through natural convection.

In addition to providing thermal dissipation of heat generated by a component 46, such as a component associated with the speaker apparatus, the heat dissipation structure 40 is configured to provide acoustic absorption for the sound waves propagating through the speaker cavity 24. In this regard, the sound waves generated by the speaker 22 that propagate through the speaker cavity propagate through the air gaps between the plurality of tubes 44 and experience visco-thermal losses which effectively lower the speed of sound and increase the effective volume of the cavity, thereby reducing the impedance to vibration of the diaphragm 26 and improving the acoustic performance of the speaker, particularly at lower frequencies.

Visco-thermal effects in acoustics are significant when the thermal and viscous penetration depths are of a significant size relative to the cross-sectional area of the on-coming sound wave. For example, sound waves propagating through submillimeter gaps between the tubes 44 are greatly attenuated by visco-thermal losses. The penetration depths are dependent on properties of the fluid, as well as being inversely proportional to the square root of frequency, so the visco-thermal losses are larger at lower frequencies. In addition to the size of the gap between tubes, the reactance of the volume between the inter-tube gaps also affects the absorption response. This reactance is dictated by the spacing between the gap and the nearest reflecting surface in the direction that the wave propagates. This reactance of the volume between the inter-tube gaps affects the absorption response of the gap by increasing and decreasing the absorption experienced by different frequency bands of sound. Thus, the inter-tube gaps may be sized to control the penetration depth and correspondingly the visco-thermal loss, while the volume between the inter-tube gaps may be sized to control the frequency of the sound waves that most greatly experience the visco-thermal loss.

An alternative embodiment of the speaker apparatus is depicted in FIGS. 4 and 5. In these embodiments, in addition to or instead of the heat sink, the heat dissipation structure 40 includes a heat pipe 50 having a phase change material disposed therein. The phase change material inside the heat pipe is chosen based on the intended operating temperature range and the material of the heat pipe. In some embodiments, the phase change material is copper-water or aluminium-acetone. As shown in FIGS. 4 and 5, the heat pipe includes an evaporator 52 in thermal communication with the component 46 that generates heat, either directly as illustrated or via a thermal path from the component, and a condenser 54 that extends further into the speaker cavity 24 than the evaporator. In the evaporator, the heat generated by the component causes the phase change material to change from liquid to vapor, thereby absorbing at least some of the heat generated by the component. The resulting vapor propagates through the heat pipe, such as by rising through the heat pipe in the illustrated orientation, and then condenses within the condenser in order to reject the heat carried by the phase change material into the speaker cavity. As such, the heat pipe facilitates the propagation of the heat from the component that generates the heat, either directly from the component or via a thermal path leading from the component, further into the speaker cavity in order to dissipate the heat. In addition to heat dissipation, the heat dissipation structure of the example embodiment depicted in FIGS. 4 and 5 also provides acoustic absorption for the sound waves propagating through the speaker cavity.

In the embodiment depicted in FIG. 4, the heat pipe 50 is a straight heat pipe that extends from the evaporator 52 in thermal communication with the component 46, such as the component associated with the speaker apparatus, that generates heat to the condenser 54 that is disposed further into the speaker cavity 24 than the evaporator. The evaporator of the heat pipe may be placed in thermal communication with the component that generates heat in various manners. As shown in FIG. 4, for example, the evaporator of the heat pipe may be positioned proximate the component. Alternatively, the evaporator of the heat pipe may be positioned proximate a thermal path that leads from a more remote component that generates heat in order to effectively be in thermal communication with the component. In the example embodiment depicted in FIG. 4, the heat received from the component that generates heat causes the phase change material within the heat pipe to change from liquid to vapor within the evaporator. The vapor rises through the heat pipe to the condenser that is disposed further within the speaker cavity. The heat is then rejected as heat into the speaker cavity such that the phase change material condenses within the condenser and the resulting condensate is driven back to the evaporator via capillary action.

In an alternative embodiment depicted in FIG. 5, the heat pipe 50 is a looped heat pipe configured to circulate the phase change material through the speaker apparatus. The looped heat pipe may define a closed loop through which the phase change material circulates. In an example embodiment, the looped heat pipe provides an increased or enlarged condenser 54 for facilitating greater heat dissipation. In this regard, the condenser may be formed by a serpentine portion of the heat pipe consisting of a plurality of loops, thereby increasing the effective length or area of the condenser and allowing for greater heat dissipation within the speaker cavity 24. By increasing or decreasing the number of loops that form the serpentine portion of the condenser, the effective condenser area is correspondingly increased or decreased, respectively. Thus, the number of loops that form the serpentine portion of the condenser may be defined based upon the anticipated heat load, while also taking into consideration the decrease in the rate at which the phase change material returns to the evaporator 52 to absorb additional heat from the component 46 as the area of the condenser is increased.

Although not illustrated, the evaporator 52 of the heat pipe 50, such as a straight heat pipe or a looped heat pipe, may have a serpentine configuration in an example embodiment. In this regard, the evaporator may include a plurality of loops positioned proximate the component 46 that generates heat or proximate the thermal path that leads from the component. As a result of the serpentine configuration, the evaporator of this embodiment of the heat pipe may be configured to absorb a greater percentage of the heat generated by the component, thereby providing for enhanced cooling of the component.

The heat pipe 50 in the embodiments of FIGS. 4 and 5 may be a cylindrical tube. In other embodiments, however, the heat pipe is a flat heat pipe in which the width of the heat pipe extending into and out of the page in FIGS. 4 and 5 is greater, such as substantially greater, than the width of the heat pipe extending left and right relative to the orientation of FIGS. 4 and 5. While a single heat pipe is depicted in the cross-sectional views of FIGS. 4 and 5, the speaker apparatus may include a plurality of heat pipes disposed side by side in parallel with one another, with the heat pipes spaced apart from one another in a direction that extends into and out of the page in FIGS. 4 and 5.

As noted above, the heat dissipation structure 40 is configured to provide acoustic absorption for the sound waves propagating through the speaker cavity 24. In this regard, the dimensions of the heat pipe may be selected such that the heat pipe 50 diffracts or scatters sound waves generated by the speaker 22, at least the sound waves generated by the speaker at certain frequencies. The diffraction or scattering of the sound waves will serve to diffuse the sound waves, thereby increasing the path length of the sound waves through the speaker cavity and increasing absorption of the sound waves. This diffraction or scattering effect becomes significant when the length scales of the tube geometry approach the wavelength of the acoustic pressure wave at a given frequency. Therefore, the heat dissipation structure may be designed to have parameters such as the tube diameters and tube lengths to permit some control over the frequencies where diffraction or scattering would be significant. For example, as the tube diameter increases, the frequency range of diffraction or scattering will extend to lower frequencies. Similarly, as the tube length increases, the frequency range of diffraction or scattering will extend to lower frequencies.

Additionally or alternatively, in an embodiment that employs a looped heat pipe 50 having a serpentine condenser 54, the plurality of loops of the serpentine condenser may be uniform with the same spacing therebetween. The spacing of the loops may be configured such that each U-shaped section of the serpentine condenser acts as a resonant chamber. Such a resonant chamber affects the impedance of the speaker and provides an additional tunable parameter to define the acoustic response of the speaker cavity. In this regard, since each of these resonant chambers are open at one end, the resonances of each chamber will be coupled with each other in order to define the overall resonance characteristics of the speaker cavity 24 which may be tuned based upon the size and shape of the respective chambers.

As also shown in FIGS. 4 and 5, the speaker apparatus of certain example embodiments may include a porous medium 60 disposed within the speaker cavity 24. The porous medium is formed of a thermally conductive material and, in one embodiment, is a metallic mesh. While the metallic mesh may be formed of various materials, the metallic mesh of one embodiment is formed of aluminum. The porous medium may define irregular air channels therethrough. Alternatively, the porous medium may define uniform apertures including air channels of uniform dimensions, angles, etc. The heat pipe 50 extends through the porous medium and into the speaker cavity. As a result of its construction from a thermally conductive material, the porous medium facilitates heat dissipation from the heat pipe, such as from the condenser 54 of the heat pipe as well as the further dissipation of the heat rejected from the heat pipe throughout the speaker cavity and into the environment. Although not illustrated, the heat dissipation structure 40 of the embodiment depicted in FIG. 2 that includes a plurality of tubes 44 extending into the speaker cavity may also include a porous medium, such as a metallic mesh, disposed within the speaker cavity through which the plurality of tubes extend.

In an example embodiment, the porous medium 60 may be additively manufactured from a metal and, in some embodiments, the entire speaker cavity 24 including the heat dissipation structure 40 may be additively manufactured from layers of a metal, such as aluminum, such as by use of a selective laser melting (SLM) printer. By additively manufacturing the speaker cavity and the components therein, control over the microstructure of the porous medium, such as a metallic mesh, is provided such that the porosity, resistivity, tortuosity, thermal and viscous characteristic lengths of the porous medium may be controlled. Assuming that SLM or some other additive manufacturing approach is undertaken, these parameters, which are related to the microstructure of the material, may be controlled in the manufacturing process. The thermal and viscous characteristic lengths, for example, are influenced by the size of the pores as well as the size of the openings connecting neighboring pores, and the thermal and viscous characteristic lengths may, in turn, influence the acoustic absorption of the material.

As described above, a speaker apparatus is therefore provided in order to both receive and dissipate heat and to provide acoustic absorption for sound waves propagating through the speaker cavity 24. The heat dissipation structure 40 disposed at least partially within the speaker cavity is configured to receive heat from a component 46, such as a component associated with the speaker apparatus, e.g., a component that is disposed fully or partially within the speaker enclosure 20, and to dissipate the received heat, thereby providing for improved performance by the component associated with the speaker apparatus that generates heat. By providing acoustic absorption, the heat dissipation structure increases the effective air volume of the speaker enclosure and reduces the impedance to speaker motion, thereby providing for improved speaker performance. By providing for both heat dissipation and acoustic absorption by the heat dissipation structure disposed at least partially within the speaker cavity, the speaker apparatus of an example embodiment may provide for improved speaker performance in devices, including relatively small devices, e.g., telecommunications devices, such a mobile telephones 10, having a limited volume available for a speaker cavity and for the thermal paths necessary for heat dissipation.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed is:

1. A speaker apparatus comprising:
   a speaker;
   a speaker cavity configured to receive sound waves emitted by the speaker for propagation through the speaker cavity; and
   a heat dissipation structure disposed at least partially within the speaker cavity, wherein the heat dissipation structure comprises a heat sink and a plurality of tubes extending outwardly from the heat sink, wherein the heat sink is configured to receive heat from a component that generates heat and the tubes are configured such that the heat received by the heat sink then flows from the heat sink to the tubes, and wherein the heat dissipation structure is configured to provide acoustic absorption for the sound waves propagating through the speaker cavity.

2. A speaker apparatus according to claim 1 wherein the plurality of tubes are formed of copper.

3. A speaker apparatus according to claim 1 wherein the speaker comprises a diaphragm that extends across an opening, and wherein the plurality of tubes are configured to extend in a direction so as to cross the opening across which the diaphragm extends.

4. A speaker apparatus according to claim 1 wherein the heat dissipation structure further comprises a porous medium disposed within the speaker cavity through which the plurality of tubes extend.

5. A speaker apparatus according to claim 4 wherein the porous medium comprises a metallic mesh.

6. A speaker apparatus according to claim 1 wherein the plurality of tubes are configured such that heat dissipates therefrom via conduction.

7. A speaker apparatus comprising:
   a speaker;
   a speaker cavity configured to receive sound waves emitted by the speaker for propagation through the speaker cavity; and
   a heat dissipation structure disposed at least partially within the speaker cavity, wherein the heat dissipation structure comprises a heat sink and a plurality of tubes extending outwardly from the heat sink into the speaker cavity, wherein the heat sink is configured to receive heat from a component that generates heat and the tubes are configured such that the heat received by the heat sink then flows from the heat sink to the tubes, and wherein the plurality of tubes define gaps therebetween through which the sound waves propagate and experience losses in order to provide acoustic absorption for the sound waves propagating through the speaker cavity.

8. A speaker apparatus according to claim 7 wherein the plurality of tubes define a tube array comprised of the plurality of evenly spaced tubes.

9. A speaker apparatus according to claim 8 wherein the plurality of tubes have respective diameters equal to a spacing between neighboring tubes.

10. A speaker apparatus according to claim 7 wherein the plurality of tubes are formed of a thermally conductive material.

11. A speaker apparatus according to claim 7 wherein the plurality of tubes are formed of copper.

12. A speaker apparatus according to claim 7 wherein the heat sink is formed of a metal and wherein the heat dissipation structure further comprises a thermal interface material between the heat sink and the component that generates heat.

13. A speaker apparatus according to claim 7 wherein the speaker comprises a diaphragm that extends across an opening, and wherein the plurality of tubes are configured to extend in a direction so as to cross the opening across which the diaphragm extends.

14. A speaker apparatus according to claim 7 wherein the heat dissipation structure further comprises a porous medium disposed within the speaker cavity through which the plurality of tubes extend.

15. A speaker apparatus according to claim 14 wherein the porous medium comprises a metallic mesh.

16. A speaker apparatus according to claim 7 wherein the plurality of tubes are configured such that heat dissipates therefrom via conduction.

* * * * *